(12) United States Patent
Kawabata et al.

(10) Patent No.: US 10,847,702 B2
(45) Date of Patent: Nov. 24, 2020

(54) SEMICONDUCTOR MODULE

(71) Applicant: Panasonic Intellectual Property Management Co., Ltd., Osaka (JP)

(72) Inventors: Takeshi Kawabata, Osaka (JP); Kiyomi Hagihara, Osaka (JP); Takashi Yui, Shiga (JP); Naofumi Koga, Osaka (JP)

(73) Assignee: PANASONIC SEMICONDUCTOR SOLUTIONS CO., LTD., Kyoto (JP)

( * ) Notice: Subject to any disclaimer, the term of this patent is extended or adjusted under 35 U.S.C. 154(b) by 9 days.

(21) Appl. No.: 16/285,850

(22) Filed: Feb. 26, 2019

(65) Prior Publication Data

US 2019/0189881 A1 Jun. 20, 2019

Related U.S. Application Data

(63) Continuation of application No. PCT/JP2018/030684, filed on Aug. 20, 2018.

(30) Foreign Application Priority Data

Nov. 15, 2017 (JP) ................. 2017-220115

(51) Int. Cl.
*H01L 33/64* (2010.01)
*H01L 33/62* (2010.01)
*H01L 33/60* (2010.01)
*H01L 23/00* (2006.01)
*H01L 25/075* (2006.01)

(52) U.S. Cl.
CPC ............ *H01L 33/647* (2013.01); *H01L 24/00* (2013.01); *H01L 25/0753* (2013.01); *H01L 33/60* (2013.01); *H01L 33/62* (2013.01)

(58) Field of Classification Search
CPC ................ H01L 33/647; H01L 33/62; H01L 2924/19107; H01L 2224/16227;
(Continued)

(56) References Cited

U.S. PATENT DOCUMENTS

2011/0114706 A1* 5/2011 Sasaoka ............... B23K 1/0016
228/164
2013/0119431 A1 5/2013 Suzuki et al.
(Continued)

FOREIGN PATENT DOCUMENTS

JP H10-189801 A 7/1998
JP 2012-080012 A 4/2012
(Continued)

OTHER PUBLICATIONS

International Search Report issued in PCT/JP2018/030684 dated Sep. 25, 2018.

*Primary Examiner* — Tucker J Wright
(74) *Attorney, Agent, or Firm* — McDermott Will & Emery LLP

(57) ABSTRACT

A semiconductor module includes: a semiconductor element; a wiring substrate on which the semiconductor element is mounted; a heat dissipation substrate; a first metal material that bonds the wiring substrate and the heat dissipation substrate; and a second metal material that bonds the wiring substrate and the heat dissipation substrate and has a different melting point from the first metal material. Each of the following is at least partially bonded: the first metal material and the wiring substrate, the first metal material and the heat dissipation substrate, the second metal material and the wiring substrate, the second metal material and the heat dissipation substrate, and the first metal material and the second metal material. Each of the following is bonded by alloying: the first metal material and the wiring substrate, the first metal material and the heat dissipation substrate, and the first metal material and the second metal material.

21 Claims, 13 Drawing Sheets

(58) Field of Classification Search
CPC . H01L 2224/18161; H01L 2224/15311; H01L 21/4871–4882; H01L 23/36–3738; H01L 2224/16151–16268; H01L 2224/15–17519; H01L 2224/73103–73104; H01L 2224/73153; H01L 2224/73203–73209; H01L 2224/73253–73261; H01L 2224/432; H01L 24/27; H01L 24/83; H01L 2224/30505; H01L 2224/301–30183; H01L 2224/30051; H01L 2224/3003; H01L 2224/3051–30519; H01L 2224/32151–32268

See application file for complete search history.

(56) References Cited

U.S. PATENT DOCUMENTS

| | | | |
|---|---|---|---|
| 2018/0040792 A1 | 2/2018 | Kawabata et al. | |
| 2018/0051871 A1 | 2/2018 | Kitamura et al. | |

FOREIGN PATENT DOCUMENTS

| | | | |
|---|---|---|---|
| JP | 2012-109521 A | 6/2012 | |
| JP | 2013-105929 A | 5/2013 | |
| JP | 2014-093148 A | 5/2014 | |
| JP | 2015-185611 A | 10/2015 | |
| JP | 2016-177979 A | 10/2016 | |
| JP | 2017-069401 A | 4/2017 | |
| WO | 2016/147252 A1 | 9/2016 | |
| WO | 2017/163593 A1 | 9/2017 | |

* cited by examiner (a)

(b)

(c)

SEMICONDUCTOR MODULE

CROSS REFERENCE TO RELATED APPLICATIONS

This application is a U.S. continuation application of PCT International Patent Application Number PCT/JP2018/030684 filed on Aug. 20, 2018, claiming the benefit of priority of Japanese Patent Application Number 2017-220115 filed on Nov. 15, 2017, the entire contents of which are hereby incorporated by reference.

BACKGROUND

1. Technical Field

The present disclosure relates to semiconductor modules.

2. Description of the Related Art

In recent years, light-emitting diodes (LEDs) consume less electric power and have been widely used as optical elements in place of incandescent lamps or fluorescent lamps. In consideration of a demand for downsizing package sets to be mounted and electrical and optical design ease, a transition is being made from semiconductor packages on which semiconductor elements are mounted to modules on which peripheral components are mounted separately from semiconductor elements or a semiconductor package.

On such an occasion, it is increasingly important that semiconductor modules have high heat dissipation capacity with an increase in output of semiconductor elements, and semiconductor modules have been developed that include a bonding material having high thermal conductivity and a wiring substrate or metal substrate having high heat dissipation capacity (see, for example, Patent Literature 1 (Japanese Unexamined Patent Application Publication No. 2012-109521) and Patent Literature 2 (Japanese Unexamined Patent Application Publication No. 2013-105929)).

SUMMARY

With the above configuration, however, when a wiring substrate or sub-mount, on which semiconductor elements have been mounted, is mounted onto or bonded to a heat dissipation substrate, it is difficult to ensure mounting position accuracy in an X-axis direction and a Y-axis direction (hereinafter referred to as XY) and control height in a Z-axis direction (hereinafter referred to as Z). For this reason, it is necessary to increase a time for a mounting head tool to hold the sub-mount so as to satisfy mounting accuracy (height, inclination, etc.) required for an optical element etc., and it is difficult to perform mounting in a short time.

In view of the above problem, the present disclosure has an object to provide a semiconductor module that enables highly accurate and quick mounting of a wiring substrate or sub-mount, on which semiconductor elements have been mounted, onto a heat dissipation substrate.

In order to solve the above problem, a semiconductor module according to one aspect of the present disclosure includes: a semiconductor element; a first substrate having a first surface on which the semiconductor element is mounted, the first substrate being electrically connected to the semiconductor element; a second substrate having a third surface on which the first substrate is mounted, the third surface facing a second surface of the first substrate opposite the first surface; a first metal material disposed between the first substrate and the second substrate, the first metal material bonding the first substrate and the second substrate; and a second metal material disposed between the first substrate and the second substrate, the second metal material bonding the first substrate and the second substrate and having a melting point different from a melting point of the first metal material. Each of the following is at least partially bonded: (a) the first metal material and the first substrate, (b) the first metal material and the second substrate, (c) the second metal material and the first substrate, (d) the second metal material and the second substrate, and (e) the first metal material and the second metal material. Each of the following is bonded by alloying: (a) the first metal material and the first substrate, (b) the first metal material and the second substrate, and (c) the first metal material and the second metal material.

Moreover, a method for manufacturing a semiconductor module according to one aspect of the present disclosure is a method for manufacturing a semiconductor module in which a first substrate including a semiconductor is mounted on a second substrate, the method including: mounting a first metal material onto the second substrate; mounting and bonding a second metal material onto the second substrate, the second metal material having a melting point higher than a melting point of the first metal material; applying pressure to the first substrate in contact with the second metal material so as to plastically deform the second metal material; and bonding the second substrate and the first substrate with the first metal material and the second metal material by thermal fusion of the first metal material while the second metal material is being plastically deformed by the applying. Each of the following is at least partially bonded: (a) the first metal material and the first substrate, (b) the first metal material and the second substrate, (c) the second metal material and the first substrate, (d) the second metal material and the second substrate, and (e) the first metal material and the second metal material. Each of the following is bonded by alloying: (a) the first metal material and the first substrate, (b) the first metal material and the second substrate, (c) the second metal material and the first substrate, and (d) the first metal material and the second metal material.

A semiconductor module according to the present disclosure enables highly accurate and quick mounting of a wiring substrate or sub-mount, on which semiconductor elements have been mounted, onto a heat dissipation substrate.

BRIEF DESCRIPTION OF DRAWINGS

These and other objects, advantages and features of the disclosure will become apparent from the following description thereof taken in conjunction with the accompanying drawings that illustrate a specific embodiment of the present disclosure.

DETAILED DESCRIPTION OF THE EMBODIMENTS (Underlying Knowledge Forming Basis of the Present Disclosure)

Figure 17:
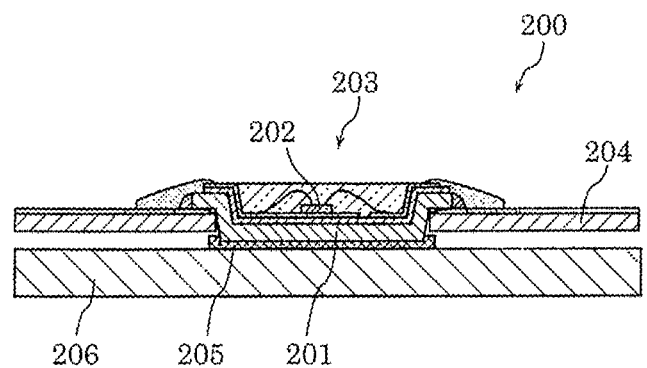
FIG. 17 is a cross-sectional diagram illustrating a first example of a semiconductor module according to a conventional technique.

FIG. 17 illustrates a first example of a semiconductor module according to a conventional technique. In semiconductor module 200 shown in FIG. 17, LED chip 202 is mounted on LED package substrate 201. Moreover, LED package 203 is mounted on wiring substrate 204. The underneath of LED package 203 is bonded to heat sink plate 206 by soldering or with binder 205 having high thermal conductivity.

Figure 18:
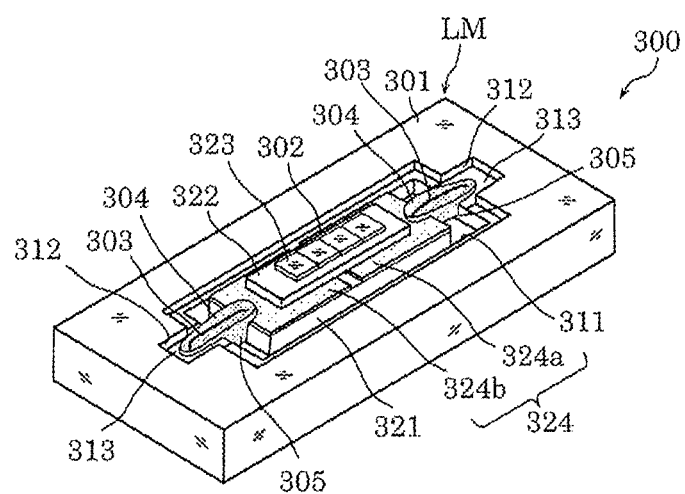
FIG. 18 is a cross-sectional diagram illustrating a second example of the semiconductor module according to the conventional technique.

FIG. 18 illustrates a second example of the semiconductor module according to the conventional technique. In semiconductor module 300 shown in FIG. 18, LED elements (semiconductor elements) 323 are electrically connected to cathode land 324a and anode land 324b of heat dissipation substrate 321 via sub-mount 322 that is a mounting body including a mounted wiring substrate, and sub-mount 322 is mounted on the top surface of heat dissipation substrate 321.

With the above configuration, however, when the wiring substrate or sub-mount 322, on which LED elements 323 have been mounted, are mounted onto or bonded to heat dissipation substrate 321, it is difficult to ensure mounting position accuracy in XY and control height in the Z-axis direction. The following specifically explains the reason.

Generally, in a semiconductor module including a wiring substrate or sub-mount on which semiconductor elements are mounted, and a heat dissipation substrate on which the wiring substrate is mounted, the optical center is determined with reference to the optical positions of the semiconductor elements. When the semiconductor module is mounted onto a package, the reference holes of the heat dissipation substrate are used as a reference. Accordingly, in the semiconductor module, there is a stringent demand for mounting accuracy for the optical center and the reference positions of the heat dissipation substrate. As a result, bonding the wiring substrate or the sub-mount and the heat dissipation substrate requires highly accurate positioning.

For example, when the sub-mount mounting method disclosed in PTL 2 is applied to the above conventional configuration, heat dissipation substrate 321 is heated first, and a bonding material (die bonding material) is mounted onto heat dissipation substrate 321 and melted by raising temperature. Next, sub-mount 322 is picked up and mounted onto the bonding material by a mounting head tool (not shown). At this time, the mounting head tool is placed in a predetermined position holding sub-mount 322 so as to ensure the mounting accuracy in the X-axis direction and the Y-axis direction and the height in the Z-axis direction. Then, sub-mount 322 and the bonding material are bonded, held, and cooled to solidify. Here, when the mounting head tool releases sub-mount 322, sub-mount 322 is not positionally fixed, and a variation in the mounting accuracy and the height cannot be controlled.

A heat dissipation substrate including metal such as commonly used Cu has high heat capacity and needs a very long time to be heated and cooled to a desired temperature. For this reason, a takt time for mounting gets longer. In addition, when a long time for the mounting head tool to hold the sub-mount is not set aside, it is not possible to satisfy the mounting accuracy and desired accuracy such as height and inclination required for optical elements etc. In other words, it is difficult to achieve both a reduction of the takt time and maintenance of high accuracy.

Furthermore, a high temperature is required for melting a metal bonding material requiring a high temperature. For this reason, it takes a longer time to increase and decrease temperature from ordinary temperature, and the takt time gets longer. Consequently, the above problem becomes prominent.

In view of the above, the following describes, as embodiments of the present disclosure, a semiconductor module and a method for manufacturing the same that enable highly accurate and quick mounting of a wiring substrate or sub-mount, on which semiconductor elements are mounted, onto a heat dissipation substrate.

Hereinafter, the embodiments will be described in detail with reference to the drawings when appropriate. It should be noted that substantially identical components are assigned the same reference signs in the following embodiments, and description thereof may be omitted.

Moreover, each of the embodiments to be described below shows a specific example. The numerical values, shapes, materials, structural components, the arrangement and connection of the structural components, steps, the processing order of the steps, etc. shown in the following embodiments are mere examples, and are not intended to limit the scope of the present disclosure. Furthermore, among the structural components in the following embodiments, structural components not recited in any one of the independent claims that indicate the broadest concepts are described as optional structural components. However, unnecessarily detailed description may be omitted. For example, detailed descriptions of well-known matters or descriptions of components that are substantially the same as components described previous thereto may be omitted. This is to avoid unnecessary redundancy and provide easy-to-read descriptions for a person skilled in the art.

It should be noted that the accompanying drawings and the following description are provided in order that a person skilled in the art sufficiently understands the present disclosure, and thus are not intended to limit the subject matter of the claims.

Embodiment 1

Hereinafter, semiconductor module 100 according to Embodiment 1 will be described with reference to FIG. 1

[1. Configuration of Semiconductor Module]

Figure 1:
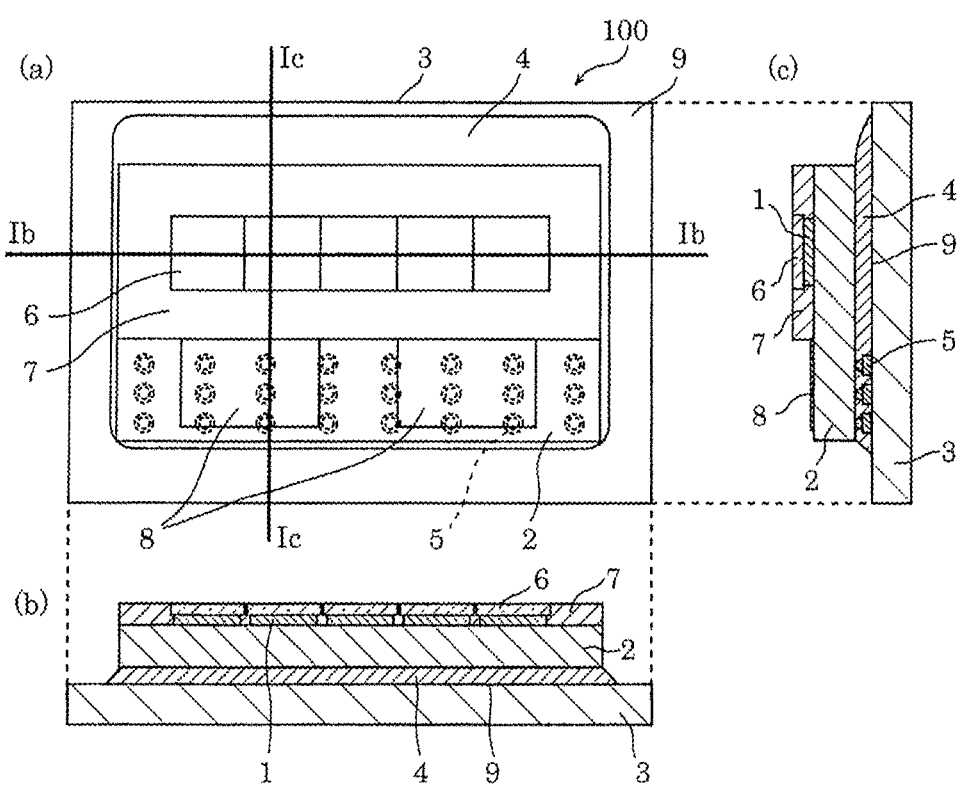
FIG. 1 is a schematic diagram illustrating a configuration of a semiconductor module according to Embodiment 1, wherein (a) is a plan view of the configuration, (b) is a cross-sectional view of the configuration taken along line Ib-Ib in (a), and (c) is a cross-sectional view of the configuration taken along line Ic-Ic in (a).

FIG. 1 is a schematic diagram illustrating a configuration of semiconductor module 100 according to the present embodiment. (a) in FIG. 1 is a plan view of the configuration. (b) in FIG. 1 is a cross-sectional view of the configuration taken along line Ib-Ib in (a). (c) in FIG. 1 is a cross-sectional view of the configuration taken along line Ic-Ic in (a).

Semiconductor module 100 shown in (a) to (c) in FIG. 1 includes: semiconductor element 1; wiring substrate 2 that has a first surface on which semiconductor element 1 is mounted, and is electrically connected to semiconductor element 1; heat dissipation substrate 3 that has a third surface on which wiring substrate 2 is mounted, the third surface facing a second surface of wiring substrate 2 opposite to the first surface; and first metal material 4 and second metal material 5 that bond wiring substrate 2 and heat dissipation substrate 3. In the present embodiment, wiring substrate 2 and heat dissipation substrate 3 are a first substrate and a second substrate, respectively. It should be noted that in semiconductor module 100, the direction of the long side of wiring substrate 2 is referred to as an X-axis direction, the direction of the short side of wiring substrate 2 is referred to as a Y-axis direction, and a direction orthogonal to the X-axis direction and the Y-axis direction is referred to as a Z-axis direction.

Semiconductor element 1 is, for example, an optical element, and a light-emitting element such as an LED or laser is used as semiconductor element 1. Semiconductor element 1 is mounted on wiring substrate 2 and electrically connected to wiring substrate 2. It should be noted that a sub-mount is a general term for a state in which semiconductor element 1 is mounted on wiring substrate 2.

Further, the surface of semiconductor element 1 may be covered with light-transmissive component 6 so as to ensure optical characteristics. Light-transmissive component 6 is, for example, a fluorescent body. Light from semiconductor element 1 is emitted to the outside through light-transmissive component 6.

It should be noted that an example in which semiconductor module 100 includes an LED as semiconductor element 1 will be described in detail below.

Wiring substrate 2 is a substrate on which electrodes used for connection to semiconductor element 1 and wires electrically connected to semiconductor element 1 are disposed. It should be noted that a plating material may be disposed as a first metal film on the surface of wiring substrate 2. Examples of the plating material disposed as the first metal film may include a material including Au such as a Ni—Pd—Au plating material.

Semiconductor elements 1 are mounted on the first surface of wiring substrate 2. A control element other than semiconductor elements 1 may be mounted on wiring substrate 2. With this, the emission manner, luminosity, etc. of semiconductor elements 1 may be controlled.

Moreover, wiring board 2 is required to have high heat dissipation capacity so that heat generated from semiconductor elements 1 is dissipated. At the same time, wiring board 2 needs to have a coefficient of linear expansion relatively close to that of semiconductor elements 1 so that semiconductor elements 1 are accurately mounted and the reliability of the mounting positions of semiconductor elements 1 is ensured. Specifically, wiring substrate 2 includes, for example, aluminum nitride. In this regard, however, wiring substrate 2 is not limited to aluminum nitride and may be, for example, an organic substrate including a ceramic material or a resin material, when such an organic material satisfies the demand for the heat dissipation capacity and the coefficient of linear expansion.

In addition to the electrodes and wires used for the connection to semiconductor elements 1, electrodes 8 for electrically connecting semiconductor elements 1 and heat dissipation substrate 3, which are described later, are disposed on wiring substrate 2.

Heat dissipation substrate 3 is a substrate on which wiring substrate 2 on which semiconductor elements 1 are mounted is mounted, and that dissipates heat of semiconductor elements 1 conducted through wiring substrate 2. In heat dissipation substrate 3, wiring substrate 2 is mounted on the third surface facing the second surface opposite the first surface of wiring substrate 2.

Heat dissipation substrate 3 includes, for example, a metal material such as copper or aluminum. The third surface of heat dissipation substrate 3 includes die pad region 9 for connecting to the second surface of wiring substrate 2, and electrodes 10 (see FIG. 8) for electrically connecting to electrodes 8 on wiring substrate 2. Die pad region 9 is a bonding pad for bonding wiring substrate 2, and is a region in which a second metal film is disposed on the surface of a base material disposed on the third surface of heat dissipation substrate 3, by plate processing. The plating material is a metal film including, for example, Au. It should be noted that the plating material disposed as the second metal film is not limited to Au, and may be a plating material including, for example, NiAu. For example, die pad region 9 may be disposed by applying a Ni—Pd—Au plating material to the surface of a Cu base material.

Moreover, heat dissipation substrate 3 has reference holes (not shown) that serve as a reference for mounting when heat dissipation substrate 3 is mounted as completed semiconductor module 100 on an optical device. It should be noted that the reference holes are used for threadably mounting semiconductor module 100 onto the optical device at the position corresponding to the reference holes of the optical device.

First metal material 4 and second metal material 5 are disposed between heat dissipation substrate 3 and wiring substrate 2. Heat dissipation substrate 3 and wiring substrate 2 are bonded to each other with first metal material 4 and second metal material 5. It should be noted that the term "bond" includes metallic bond and alloying.

First metal material 4 is a solder material that is melted by heating to wettingly spread between wiring substrate 2 and heat dissipation substrate 3, and bonds wiring substrate 2 and heat dissipation substrate 3. In a plan view of semiconductor module 100, first metal material 4 covers the projection plane of semiconductor elements 1. In addition, as shown in (c) in FIG. 1, first metal material 4 is bonded to second metal material 5.

First metal material 4 is generally a metal die bonding material having high heat dissipation capacity and wettability relative to wiring substrate 2 and heat dissipation substrate 3. For example, first metal material 4 is an AuSn-based solder material. It should be noted that first metal material 4 may be, for example, a material having a high metal filling factor, such as a SnAgCu-based solder material and an Ag nanomaterial, in addition to the AuSn-based solder material.

It should be noted that first metal material 4 may be set to have a coefficient of linear expansion between those of wiring substrate 2 and heat dissipation substrate 3 so that first metal material 4 absorbs a difference in heat expansion between wiring substrate 2 and heat dissipation substrate 3 to maintain the reliability of bonding between wiring substrate 2 and heat dissipation substrate 3. For example, when wiring substrate 2 includes aluminum nitride, aluminum nitride has a coefficient of linear expansion of 4 to 5 ppm/k, and when heat dissipation substrate 3 includes Cu, since Cu has a coefficient of linear expansion of 16 to 18 ppm/k, first metal material 4 may include a material having a coefficient of linear expansion of 7 to 14 ppm/k.

As will be described later, after second metal material 5 is bonded to die pad region 9 on heat dissipation substrate 3, first metal material 4 is disposed in a different position on the same die pad region 9. For example, first metal material 4 may be disposed at the periphery of second metal material 5. The bonded surface area of first metal material 4 and wiring substrate 2 and the bonded surface area of first metal material 4 and heat dissipation substrate 3 are larger than the bonded surface area of second metal material 5 and wiring substrate 2 and the bonded surface area of second metal material 5 and heat dissipation substrate 3. Further, in a plan view of wiring substrate 2 and heat dissipation substrate 3, first metal material 4 may protrude from at least one of the sides of wiring substrate 2.

It should be noted that die pad region 9 may be the same die pad region on which first metal material 4 and second metal material 5 are disposed, and a die pad region different from a die pad region on which second metal material 5 is disposed may be provided as a die pad region on which first metal material 4 is disposed.

Second metal material 5 is a bump that is disposed between wiring substrate 2 and heat dissipation substrate 3 and pressure bonds wiring substrate 2 and heat dissipation substrate 3 by being pressured by wiring substrate 2. In a plan view of semiconductor module 100, second metal material 5 is disposed in a region other than the projection plane of semiconductor elements 1. It should be noted that in heat dissipation substrate 3, second metal material 5 may be disposed in a region other than a region in which semiconductor elements 1 and reflective resin 7 are disposed.

In a step of mounting wiring substrate 2 onto heat dissipation substrate 3, second metal material 5 is disposed so that mounting accuracy is maintained by quickly securing wiring substrate 2 and heat dissipation substrate 3. Accordingly, second metal material 5 may be a material having plastic deformability higher than that of first metal material 4. For example, second metal material 5 is a metal bump including AuSn, Au, etc. First metal material 4 and second metal material 5 may include different materials or the same material. It should be noted that when first metal material 4 and second metal material 5 include the same material, first metal material 4 and second metal material 5 are bonded by metallic bonding.

It should be noted that first metal material 4 and second metal material 5 are not electrically connected to semiconductor elements 1 and wiring substrate 2, respectively.

Figure 2A:
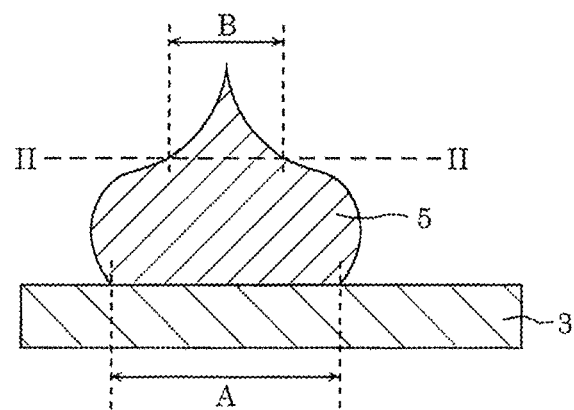
FIG. 2A is a cross-sectional schematic diagram illustrating an example of a shape of a second metal material of the semiconductor module according to Embodiment 1.

FIG. 2A is a cross-sectional schematic diagram illustrating an example of a shape of second metal material 5 of semiconductor module 100 according to the present embodiment. FIG. 2A shows second metal material 5 that is bonded to heat dissipation substrate 3 and before wiring substrate 2 is bonded. As shown in FIG. 2A, second metal material 5 before wiring substrate 2 is bonded has a shape having a tip whose cross-sectional area decreases with distance from heat dissipation substrate 3. It should be noted that second metal material 5 is not limited to the shape shown in FIG. 2A, and may have a shape etc. obtained by combining, for example, a round column and a cone, as long as the shape has a tip.

The tip of second metal material 5 is plastically deformed to, for example, the position indicated by II-II line shown in FIG. 2A due to a load applied by wiring substrate 2 being pressed against the tip, and is bonded to wiring substrate 2. It should be noted that second metal material 5 after wiring substrate 2 is bonded has bonded surface area B with wiring substrate 2 that is smaller than bonded surface area A with heat dissipation substrate 3.

Second metal material 5 may have a melting point higher than that of first metal material 4 so that a fixed state is prevented from being disturbed by remelting when first metal material 4 is bonded by heating. Further, when first metal material 4 wettingly spreads on heat dissipation substrate 3 in contact with second metal material 5, second metal material 5 may be a material that solidifies by at least first metal material 4 and part of second metal material 5 being bonded.

When first metal material 4 includes, for example, AuSn in order to satisfy the above characteristics, second metal material 5 may include Au having a melting point higher than that of AuSn. It should be noted that second metal material 5 is not limited to Au and may include other metal.

[2. Configuration of Bonding Portion]

Here, the following describes in greater detail a bonding portion between wiring substrate 2 and heat dissipation substrate 3 bonded with first metal material 4 and second metal material 5. In semiconductor module 100, each of the following is at least partially bonded: first metal material 4 and wiring substrate 2; first metal material 4 and heat dissipation substrate 3; second metal material 5 and wiring substrate 2; second metal material 5 and heat dissipation substrate 3; and first metal material 4 and second metal material 5. Here, each of the following is bonded by alloying: first metal material 4 and wiring substrate 2; first metal material 4 and heat dissipation substrate 3; and first metal material 4 and second metal material 5. It should be noted that alloying includes alloying by metallic bonding.

Figure 2B:
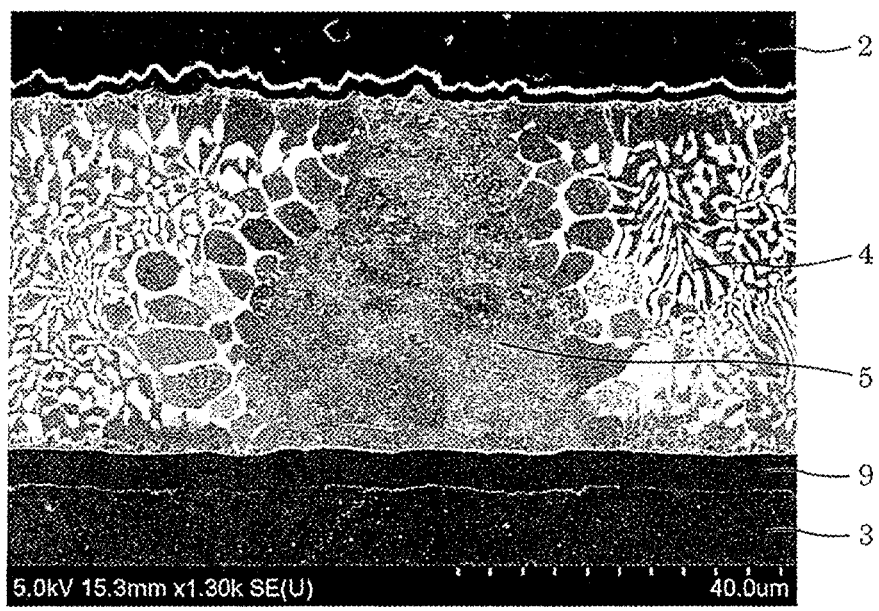
FIG. 2B is a scanning electron microscope (SEM) cross-sectional view of a bonding portion resulting from bonding a wiring substrate and a heat dissipation substrate of the semiconductor module according to Embodiment 1 with a first metal material and the second metal material.

FIG. 2B is a scanning electron microscope (SEM) cross-sectional view of a bonding portion resulting from bonding wiring substrate 2 and heat dissipation substrate 3 of semiconductor module 100 according to the present embodiment with first metal material 4 and second metal material 5. It should be noted that in FIG. 2B, solder including AuSn and a bump including Au are used as first metal material 4 and second metal material 5, respectively. White portions and grey portions indicate Sn and Au, respectively, in first metal material 4 and second metal material 5 shown in the SEM photograph of FIG. 2B.

Second metal material 5 is bonded to die pad region 9 on heat dissipation substrate 3 by ultrasonic welding before wiring substrate 2 is disposed. It should be noted that second metal material 5 may be bonded to heat dissipation substrate 3 by thermal compression bonding instead of ultrasonic welding. Specifically, second metal material 5 is bonded to a second metal film (plating material) disposed on the surface of die pad region 9. At this time, second metal material 5 and the second metal film are bonded by metallic bonding or by atoms included in second metal material 5 and the second metal film coming close to each other or clustering together.

For example, it is assumed that second metal material 5 is an Au bump and die pad region 9 is a region in which the second metal film is disposed on the surface of a Cu base material by Ni—Pd—Au plate processing. In this case, since Au of second metal material 5 and Au of the second metal film are combined by ultrasonic welding, there is no bonded interface between second metal material 5 and die pad region 9.

After second metal material 5 is bonded to die pad region 9 of heat dissipation substrate 3 as described above, and further first metal material 4 before heating is mounted on die pad region 9, wiring substrate 2 is thermal compression bonded to the upper part of second metal material 5. In other words, second metal material 5 is plastically deformed by wiring substrate 2 being brought into contact with and pressed against second metal material 5, and is bonded to wiring substrate 2 (specifically a first metal film on the surface of wiring substrate 2). With this, wiring substrate 2 is secured to heat dissipation substrate 3 via second metal material 5. Here, because wiring substrate 2 is quickly pressure bonded (or thermal compression bonded) by plastically deforming the Au bump of second metal material 5, the first metal film on the surface of wiring substrate 2 and second metal material 5 are not combined, and there is a clear bonded interface.

Moreover, since first metal material 4 is heated at a temperature greater than or equal to the melting point of first metal material 4 and less than or equal to the melting point of second metal material 5 after second metal material 5 is plastically deformed or while second metal material 5 is being plastically deformed, first metal material 4 is bonded to wiring substrate 2 and heat dissipation substrate 3 by thermal fusion while wettingly spreading at the level of the height of plastically deformed second metal material 5. At this time, as shown in FIG. 2B, in the same die pad region 9 on heat dissipation substrate 3, first metal material 4 and second metal material 5 are melted to at least partially intermingle with each other and are alloyed.

More specifically, as shown in FIG. 2B, in first metal material 4 close to second metal material 5, second metal material 5 is dissolved into an eutectic portion of first metal material 4, and metal components are clearly observed that have a grain size between the grain size of first metal material 4 and the grain size of second metal material 5. In other words, it is clear that first metal material 4 and second metal material 5 are bonded in combination.

It should be noted that depending on types of second metal material 5 and a plating material of the surface of die pad region 9, first metal material 4 and second metal material 5 are bonded by causing solid-phase diffusion or forming an alloy.

Not only wiring substrate 2 and first metal material 4 but also heat dissipation substrate 3 and first metal material 4 are melted to at least partially intermingle with each other and are alloyed. Specifically, regarding the bonding of wiring substrate 2 and first metal material 4 and the bonding of heat dissipation substrate 3 and first metal material 4, since Au of the surface plating of wiring substrate 2 and the surface plating of die pad region 9 on heat dissipation substrate 3 is diffused into first metal material 4 at a high temperature, not only the surface plating of wiring substrate 2 and first metal material 4 but also the surface plating of die pad region 9 on heat dissipation substrate 3 and first metal material 4 are combined, and there is no bonded interface.

With such a configuration, wiring substrate 2, heat dissipation substrate 3, first metal material 4, and second metal material 5 are bonded in combination, and thus it is possible to increase overall bonding strength of wiring substrate 2, heat dissipation substrate 3, first metal material 4, and second metal material 5. Further, when second metal material 5 is small, by combining first metal material 4 and second metal material 5, it is possible to increase bonding strength and bonding reliability of wiring substrate 2 and heat dissipation substrate 3.

It should be noted that the height of first metal material 4 and second metal material 5 after wiring substrate 2 and heat dissipation substrate 3 are bonded may be set between 20 μm and 70 μm in view of a balance between reliability and heat dissipation capacity. In semiconductor module 100 according to the present embodiment in an actual finished state, a variation in height of first metal material 4 and second metal material 5 is very small, and can be set to approximately ±20 μm. Moreover, when first metal material 4 is provided as a metal pellet, first metal material 4 makes it easy to maintain its height after first metal material 4 is melted. Furthermore, since first metal material 4 is disposed in a large surface area directly below semiconductor elements 1, it is possible to efficiently promote heat dissipation to heat dissipation substrate 3.

Moreover, as will be described later, electrical connection between heat dissipation substrate 3 and wiring substrate 2 may be achieved by directly bonding electrodes 8 on wiring substrate 2 and electrodes 10 on heat dissipation substrate 3 not with first metal material 4 but separately with a metal wire such as an aluminum wire, a gold wire, or a copper wire.

Furthermore, after wiring substrate 2 and heat dissipation substrate 3 are bonded with first metal material 4 and second metal material 5, though not shown, connector components, a thermistor, chip components, etc. may be mounted and soldered onto heat dissipation substrate 3 with heat such as reflow soldering, thereby manufacturing semiconductor module 100.

With the configuration of semiconductor module 100 according to the present embodiment, when wiring substrate 2 and heat dissipation substrate 3 are bonded with first metal material 4 and second metal material 5, wiring substrate 2 and heat dissipation substrate 3 can be quickly bonded by melting first metal material 4 to be in contact with second metal material 5 while second metal material 5 having a high melting point maintains a fixed state of wiring substrate 2 and heat dissipation substrate 3.

Consequently, even when wiring substrate 2 and heat dissipation substrate 3 are heated to the bonding temperature of first metal material 4 in the step of bonding, it is possible to prevent a mounting position gap between wiring substrate 2 and heat dissipation substrate 3 and displacement due to a difference between the coefficients of linear expansion of the materials. Moreover, because second metal material 5 and first metal material 4 are bonded, it is possible to more strongly maintain the fixed state after the bonding. Furthermore, since mounting head tool 11 need not hold wiring substrate 2 for a long time from the time of bonding to the time of cooling as the conventional technique, it is also possible to reduce a takt time.

It should be noted that mounting head tool 11 holds wiring substrate 2 on which semiconductor elements 1 have been mounted, by sticking fast to wiring substrate 2. Mounting head tool 11 can come into contact with and apply pressure to second metal material 5 while sticking fast to wiring substrate 2. Mounting head tool 11 is not limited to a tool that holds wiring substrate 2 by sticking fast to wiring substrate 2, and may be any tool that holds wiring substrate 2 by another method such as clamping wiring substrate 2.

[3. Semiconductor Module Including LED]

The following describes in detail the structure of semiconductor module 100 when LEDs are used as semiconductor elements 1 with reference to FIG. 1. Hereinafter, light-emitting diodes used as semiconductor elements 1 are referred to as LED elements 1.

On wiring substrate 2 including aluminum nitride, LED elements 1 are arranged in a row along the direction of the long side of wiring substrate 2. Individual LED elements 1 are flip-chip bonded to the electrodes (not shown) on wiring substrate 2. Light-transmissive component 6 is disposed via a binder (not shown) above individual LED elements 1. Reflective resin 7 is disposed in a region surrounding LED elements 1 and light-transmissive component 6 on wiring substrate 2. Reflective resin 7 covers the side surfaces of LED elements 1 and light-transmissive component 6 but exposes the top surface of light-transmissive component 6. When viewed from above, ends of reflective resin 7 correspond in position to three sides of wiring substrate 2. In FIG. 1, the lower half of the top surface of wiring substrate 2 is exposed from reflective resin 7. In other words, part of the electrodes electrically connected to LED elements 1 on wiring substrate 2 is exposed and extends from reflective resin 7.

Light-transmissive component 6 is a ceramic plate including a florescent body that wavelength-converts light emitted from LED elements 1. White light is obtained by blue light emitted from LED elements 1 and converted light wavelength-converted by the florescent body being exited through an exit surface of light-transmissive component 6. The florescent body is, for example, a publicly known material such as YAG, CASN, SiAlON, and LSN. Reflective resin 7 is, for example, a silicone resin including a reflective material such as titanium oxide.

Wiring substrate 2 is secured to die pad region 9 on heat dissipation substrate 3. The first metal film (not shown) including NiCr—Au—Ni—Au in order of proximity to wiring substrate 2 is disposed on the surface of wiring substrate 2 facing heat dissipation substrate 3. The second metal film (not shown) including Ni—Pd—Au in order of proximity to heat dissipation substrate 3 is disposed on die pad region 9 on heat dissipation substrate 3. Wiring substrate 2 and heat dissipation substrate 3 are secured to each other by second metal material 5 including Au and first metal material 4 including AuSn that are disposed between the first metal film of wiring substrate 2 and the second metal film of heat dissipation substrate 3.

When semiconductor module 100 is viewed from above, second metal material 5 is disposed only below a region other than a region in which LED elements 1 and reflective resin 7 are disposed on wiring substrate 2. In the case of semiconductor module 100 according to the present embodiment, second metal materials 5 are arranged in a matrix of three rows and eight columns. When semiconductor module 100 is viewed from above, first metal material 4 is disposed in a whole area below the region in which LED elements 1 and reflective resin 7 are disposed, and further fills a gap between second metal materials 5 arranged in the matrix. In other words, first metal material 4 is disposed in the whole area below wiring substrate 2. In consequence, only first metal material 4 is disposed immediately below LED elements 1 between wiring substrate 2 and heat dissipation substrate 3.

Moreover, the side walls of second metal materials 5 including Au are in contact with first metal material 4 including AuSn. Furthermore, in a process in which first metal material 4 spreads to fill a gap between second metal materials 5, the side walls of second metal materials 5 and first metal material 4 are melted and bonded to each other. In other words, columnar second metal materials 5 penetrate through first metal material 4 disposed on the entire surface of die pad region 9.

Since first metal material 4 is melted together with and bonded to Au of the outermost surface of the metal film of heat dissipation substrate 3 and Au of the outermost surface of the metal film of wiring substrate 2, the resultant interface is unclear. Since second metal materials 5 are combined to Au of the outermost surface of the metal film of heat dissipation substrate 3 by ultrasonic welding, metallic bonding is formed partially or entirely, and the resultant interface is unclear. Further, since second metal materials 5 are thermal compression bonded to Au of the outermost surface of the metal film of wiring substrate 2, metallic bonding is not formed, and there is a clear interface.

The high-intensity LED elements 1 generate a large amount of heat. However, since wiring substrate 2 and heat dissipation substrate 3 are directly secured by first metal material 4 in the region in which LED elements 1 are disposed, and a broad region on the back side of the region in which reflective resin 7 surrounding LED elements 1 is disposed, semiconductor module 100 having the above-described configuration can immediately dissipate the heat generated by LED elements 1 toward heat dissipation substrate 3.

Moreover, in wiring substrate 2, by disposing second metal materials 5 on the back side of a region in which reflective resin 7 is not disposed, it is possible to cause mounting head tool 11 to directly apply pressure to the top surface of wiring substrate 2. Accordingly, it is possible to secure wiring substrate 2 and heat dissipation substrate 3 by second metal materials 5 without applying pressure to reflective resin 7 having Young's modulus smaller than that of wiring substrate 2.

It should be noted that although second metal materials 5 are arranged in the matrix of three rows and eight columns in the present embodiment, at least three second metal materials 5 may be arranged. At this moment, in a plan view of heat dissipation substrate 3 on which three metal materials 5 are disposed, three second metal materials 5 may form a surface so as to keep parallelism between wiring substrate 2 and heat dissipation substrate 3. In addition, three second metal materials 5 may be arranged in a straight line depending on the machine accuracy of mounting head tool 11.

[4. Advantageous Effects etc.]

With the configuration of semiconductor module 100 according to the present embodiment, when wiring substrate 2 and heat dissipation substrate 3 are bonded with first metal material 4 and second metal material 5, wiring substrate 2 and heat dissipation substrate 3 can be quickly bonded by melting first metal material 4 to be in contact with second metal material 5 while second metal material 5 having a high melting point maintains a fixed state of wiring substrate 2 and heat dissipation substrate 3.

Consequently, even when wiring substrate 2 and heat dissipation substrate 3 are heated to the bonding temperature of first metal material 4 in the step of bonding, it is possible to prevent a mounting position gap between wiring substrate 2 and heat dissipation substrate 3 and displacement due to a difference between the coefficients of linear expansion of the materials. Moreover, because second metal material 5 and first metal material 4 are bonded, it is possible to more strongly maintain the fixed state after the bonding. Furthermore, since mounting head tool 11 need not hold wiring substrate 2 for a long time from the time of bonding to the time of cooling as the conventional technique, it is also possible to reduce a takt time. Accordingly, it is possible to manufacture semiconductor module 100 having high reliability in a short time.

Moreover, since first metal material 4 is disposed in a large surface area directly below semiconductor elements 1, heat generated in semiconductor elements 1 can be efficiently dissipated via heat dissipation substrate 3.

It should be noted that since first metal material 4 is bonded to die pad region 9 of heat dissipation substrate by being melted, first metal material 4 has a larger surface area than second metal material 5.

In semiconductor module 100 according to the present embodiment, first metal material 4 has a larger bonded surface area than second metal material, and in a projection plane in a plan view from semiconductor elements 1, the placement area of second metal material 5 is unevenly located on one side of wiring substrate 2 except a region directly below semiconductor elements 1, and the placement area of first metal material 4 almost covers a whole area directly below wiring substrate 2.

With such a configuration, when heat is dissipated from directly below semiconductor elements 1 via wiring substrate 2, heat dissipation to heat dissipation substrate 3 can be performed via first metal material 4 covering the directly below semiconductor elements 1 and having the large surface area, thereby increasing a heat dissipation surface area. Consequently, it is possible to improve heat dissipation capacity from semiconductor elements 1.

Moreover, in semiconductor module 100 shown in FIG. 1, semiconductor elements 1 are displaced from the center of wiring substrate 2, only first metal material 4 is disposed below wiring substrate 2 directly below semiconductor elements 1, and second metal material 5 is disposed below wiring substrate 2 where semiconductor elements 1 are not mounted. In other words, in a plan view of heat dissipation substrate 3 on which second metal material 5 is disposed, second metal material 5 is disposed between a region in which semiconductor elements 1 are disposed and one side of wiring substrate 2.

With such a configuration, when second metal material 5 is bonded to wiring substrate 2, it is possible to easily maintain the flatness of second metal material 5 by causing mounting head tool 11 to press the flat portion of wiring substrate 2 without being in contact with semiconductor elements 1.

Variation 1 of Embodiment 1

Next, semiconductor modules 100b to 100d according to Variations 1a to 1c of Embodiment 1 will be described. It should be noted that in semiconductor modules 100b to 100d described blow, LED elements 1 are used as semiconductor elements 1.

Figure 3:
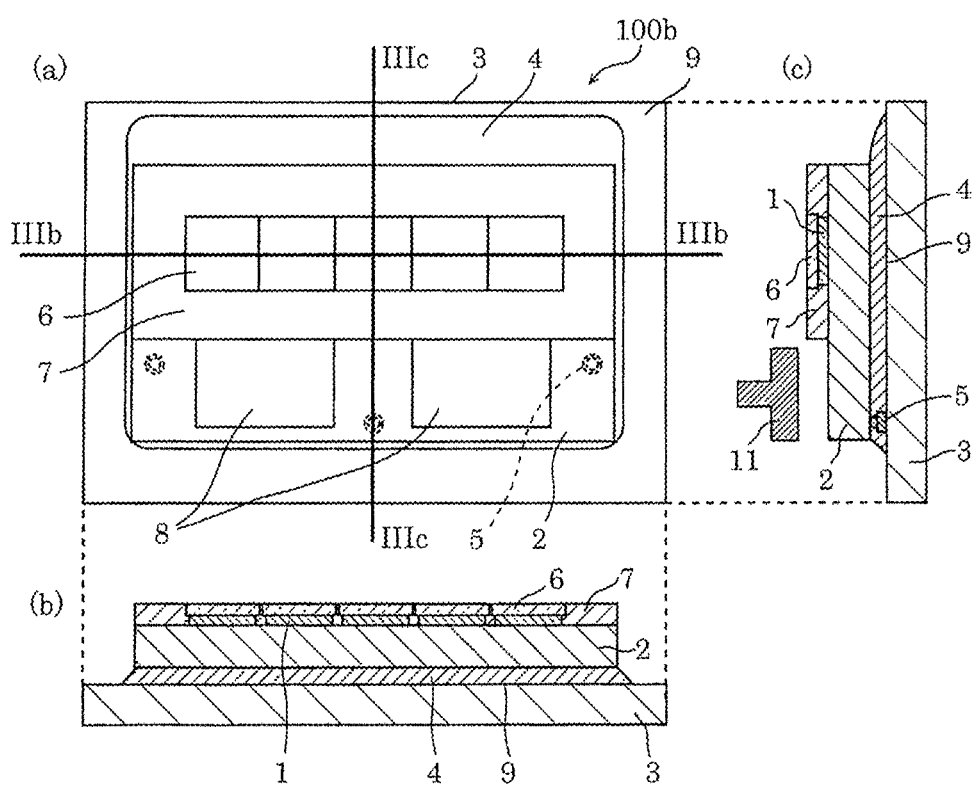
FIG. 3 is a schematic diagram illustrating a configuration of a semiconductor module according to Variation 1a of Embodiment 1, wherein (a) is a plan view of the configuration, (b) is a cross-sectional view of the configuration taken along line IIIb-IIIb in (a), and (c) is a cross-sectional view of the configuration taken along line IIIc-IIIc in (a).

FIG. 3 is a schematic diagram illustrating a configuration of semiconductor module 100b according to Variation 1a of the present embodiment. In FIG. 3, (a) is a plan view of the configuration, (b) is a cross-sectional view of the configuration taken along line IIIb-IIIb in (a), and (c) is a cross-sectional view of the configuration taken along line IIIc-IIIc in (a).

In comparison with semiconductor module 100 shown in (a) to (c) in FIG. 1, semiconductor module 100b according to Variation 1a shown in (a) to (c) in FIG. 3 similarly includes LED elements 1, light-transmissive component 6, and reflective resin 7 disposed on wiring substrate 2, and differs in the number and arrangement of second metal materials 5. Specifically, when semiconductor module 100b is viewed from above as shown in (a) in FIG. 3, in a region except below the region in which LED elements 1 and reflective resin 7 are disposed on wiring substrate 2, and a region except below the regions in which electrodes 8 of wiring substrate 2 are disposed, second metal materials 5 are disposed in a total of three places including: two places in the vicinity of reflective resin 7 and close to both ends of wiring substrate 2; and a place away from the region in which reflective resin 7 is disposed and close to the middle of an end of wiring substrate 2.

Figure 4:
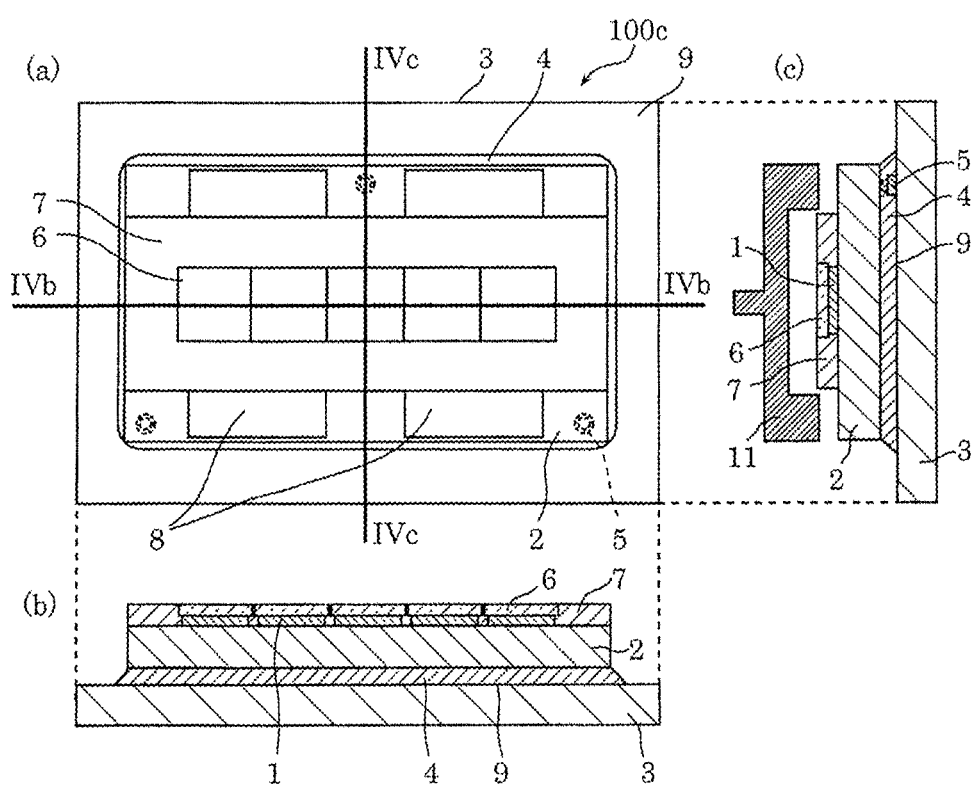
FIG. 4 is a schematic diagram illustrating a configuration of a semiconductor module according to Variation 1b of Embodiment 1, wherein (a) is a plan view of the configuration, (b) is a cross-sectional view of the configuration taken along line IVb-IVb in (a), and (c) is a cross-sectional view of the configuration taken along line IVc-IVc in (a).

FIG. 4 is a schematic diagram illustrating a configuration of semiconductor module 100c according to Variation 1b of the present embodiment. In FIG. 4, (a) is a plan view of the configuration, (b) is a cross-sectional view of the configuration taken along line IVb-IVb in (a), and (c) is a cross-sectional view of the configuration taken along line IVc-IVc in (a).

In comparison with semiconductor module 100b shown in (a) to (c) in FIG. 3, semiconductor module 100c according to Variation 1b shown in (a) to (c) in FIG. 4 differs in the arrangement of LED elements 1, light-transmissive component 6, reflective resin 7, and second metal materials 5 disposed on wiring substrate 2. Specifically, when semiconductor module 100c is viewed from above as shown in (a)

in FIG. 4, LED elements 1 and reflective resin 7 are disposed laterally through the middle of wiring substrate 2, and electrodes 8 of wiring substrate 2 are exposed on both sides of LED elements 1 and reflective resin 7. In the region except below the region in which LED elements 1 and reflective resin 7 are disposed on wiring substrate 2, and the region except below the regions in which electrodes 8 of wiring substrate 2 are disposed, second metal materials 5 are disposed in a total of three places separated by reflective resin 7 and including: a place close to the middle of an end of wiring substrate 2; and two places close to corners of other ends of wiring substrate 2.

Figure 5:
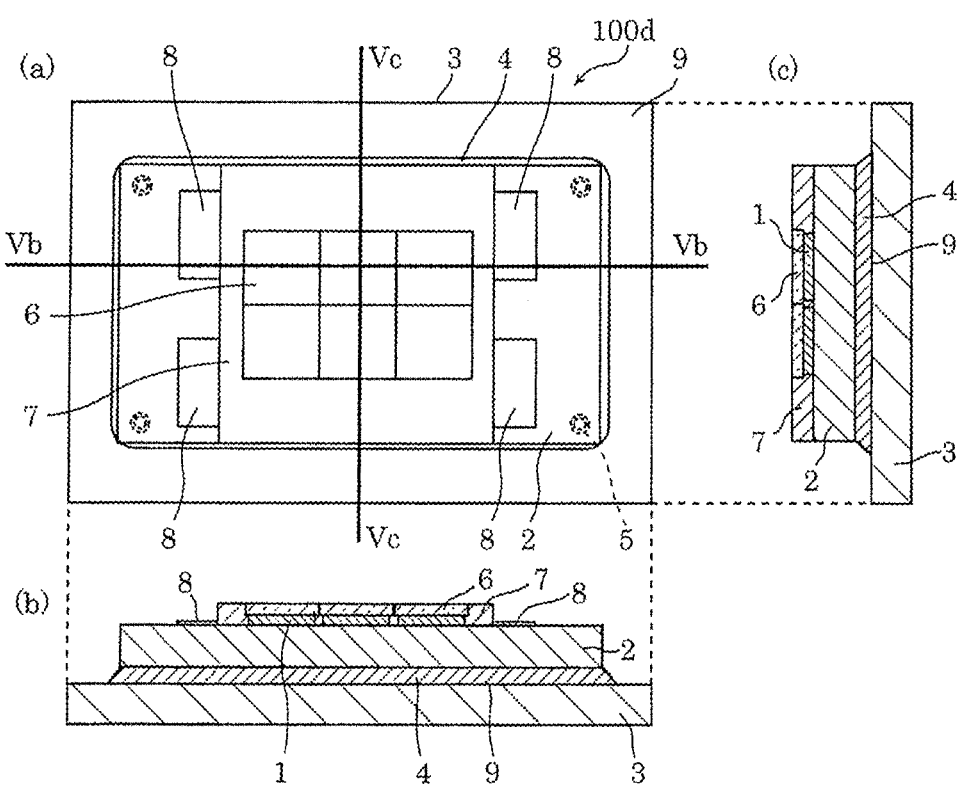
FIG. 5 is a schematic diagram illustrating a configuration of a semiconductor module according to Variation 1c of Embodiment 1, wherein (a) is a plan view of the configuration, (b) is a cross-sectional view of the configuration taken along line Vb-Vb in (a), and (c) is a cross-sectional view of the configuration taken along line Vc-Vc in (a).

FIG. 5 is a schematic diagram illustrating a configuration of semiconductor module 100d according to Variation 1c of the embodiment. In FIG. 5, (a) is a plan view of the configuration, (b) is a cross-sectional view of the configuration taken along line Vb-Vb in (a), and (c) is a cross-sectional view of the configuration taken along line Vc-Vc in (a).

In comparison with semiconductor module 100b shown in (a) to (c) in FIG. 3, semiconductor module 100d according to Variation 1c shown in (a) to (c) in FIG. 5 differs in the arrangement of electrodes 8, LED elements 1, light-transmissive component 6, reflective resin 7, and second metal materials 5 disposed on wiring substrate 2. Specifically, when semiconductor module 100d is viewed from above as shown in (a) in FIG. 5, LED elements 1 are arranged in a matrix of two rows and three columns along the direction of the long side of wiring substrate 2. Reflective resin 7 covers the side surfaces of LED elements 1 and light-transmissive component 6, and is disposed along the direction of the short side of wiring substrate 2. Electrodes 8 of wiring substrate 2 are exposed and extend from reflective resin 7 along the direction of the long side of wiring substrate 2. In the region except below the region in which LED elements 1 and reflective resin 7 are disposed on wiring substrate 2, and the region except below the regions in which electrodes 8 of wiring substrate 2 are disposed, second metal materials 5 are disposed in a total of four places close to the four corners of wiring substrate 2.

Although second metal materials 5 are arranged in the matrix in semiconductor module 100 according to Embodiment 1, second metal materials 5 are disposed below portions having the same thickness away from electrodes 8 on wiring substrate 2 in semiconductor modules 100b to 100d according to the present variations a to c.

With this configuration, in semiconductor modules 100b to 100d, by dispersedly disposing second metal materials 5 when second metal materials 5 are not allowed to have a large surface area, it is possible to easily keep parallelism between wiring substrate 2 and heat dissipation substrate 3 when wiring substrate 2 and heat dissipation substrate 3 are secured using mounting head tool 11. Second metal materials 5 may be disposed in at least three places so that a line connecting second metal materials 5 forms a surface. In addition, second metal materials 5 may be disposed in three places on a straight line depending on the machine accuracy of mounting head tool 11.

Variation 2 of Embodiment 1

Next, semiconductor module 100e according to Variation 2 of Embodiment 1 will be described. It should be noted that in semiconductor module 100e described blow, LED elements 1 are used as semiconductor elements 1.

Figure 6:
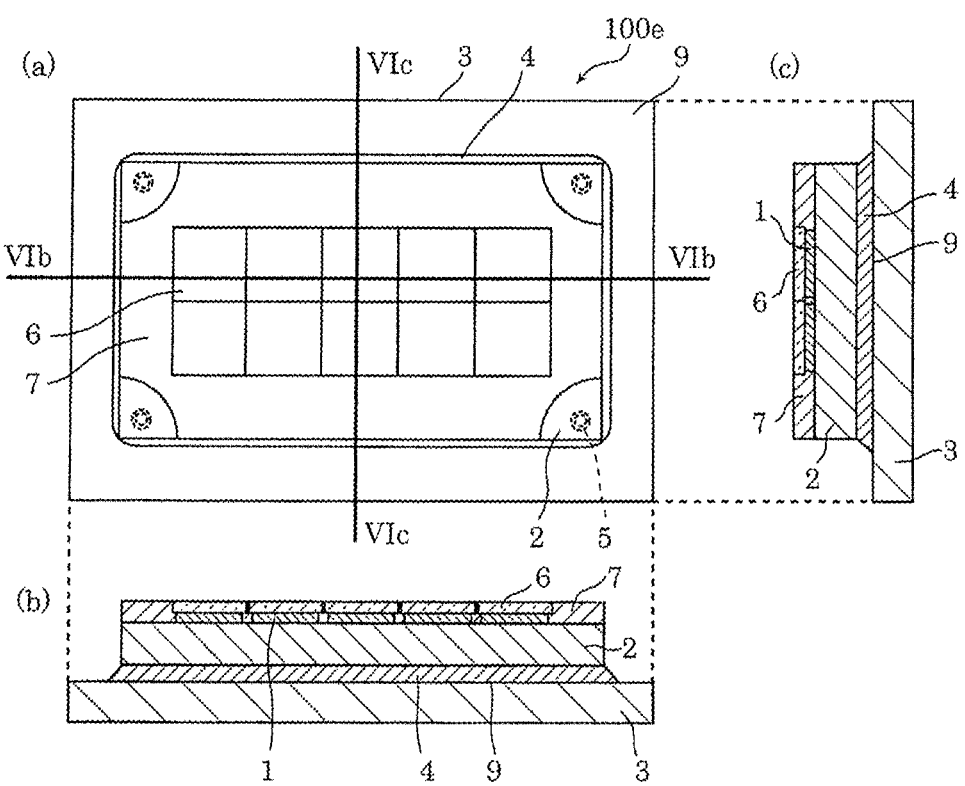
FIG. 6 is a schematic diagram illustrating a configuration of a semiconductor module according to Variation 2 of Embodiment 1, wherein (a) is a plan view of the configuration, (b) is a cross-sectional view of the configuration taken along line VIb-VIb in (a), and (c) is a cross-sectional view of the configuration taken along line VIc-VIc in (a).

FIG. 6 is a schematic diagram illustrating a configuration of semiconductor module 100e according to Variation 2 of Embodiment 1. In FIG. 6, (a) is a plan view of the configuration, (b) is a cross-sectional view of the configuration taken along line VIb-VIb in (a), and (c) is a cross-sectional view of the configuration taken along line VIc-VIc in (a).

In comparison with semiconductor module 100 shown in (a) to (c) in FIG. 1, semiconductor module 100e shown in (a) to (c) in FIG. 6 differs in the arrangement of LED elements 1, light-transmissive component 6, reflective resin 7, and second metal materials 5 disposed on wiring substrate 2. Specifically, when semiconductor module 100e is viewed from above as shown in (a) in FIG. 6, LED elements 1 are arranged in a matrix of two rows and five columns along the direction of the long side (the X-axis direction) of wiring substrate 2. Reflective resin 7 covers the side surfaces of LED elements 1 and light-transmissive component 6, and is disposed on the entire surface of wiring substrate 2 except the four corners of wiring substrate 2. In the region except below the region in which LED elements 1 and reflective resin 7 are disposed on wiring substrate 2, second metal materials 5 are disposed in all the four corners of wiring substrate 2.

With this configuration, since wiring substrate 2 is flat, by mounting head tool 11 applying pressure to the four corners of wiring substrate 2 below which second metal materials 5 are disposed, it is possible to keep parallelism when wiring substrate 2 is secured to heat dissipation substrate 3. As a result, semiconductor module 100e achieves satisfactory mounting stability between wiring substrate 2 and heat dissipation substrate 3.

Variation 3 of Embodiment 1

Next, semiconductor module 100f according to Variation 3 of Embodiment 1 will be described. It should be noted that in semiconductor module 100f described blow, LED elements 1 are used as semiconductor elements 1.

Figure 7:
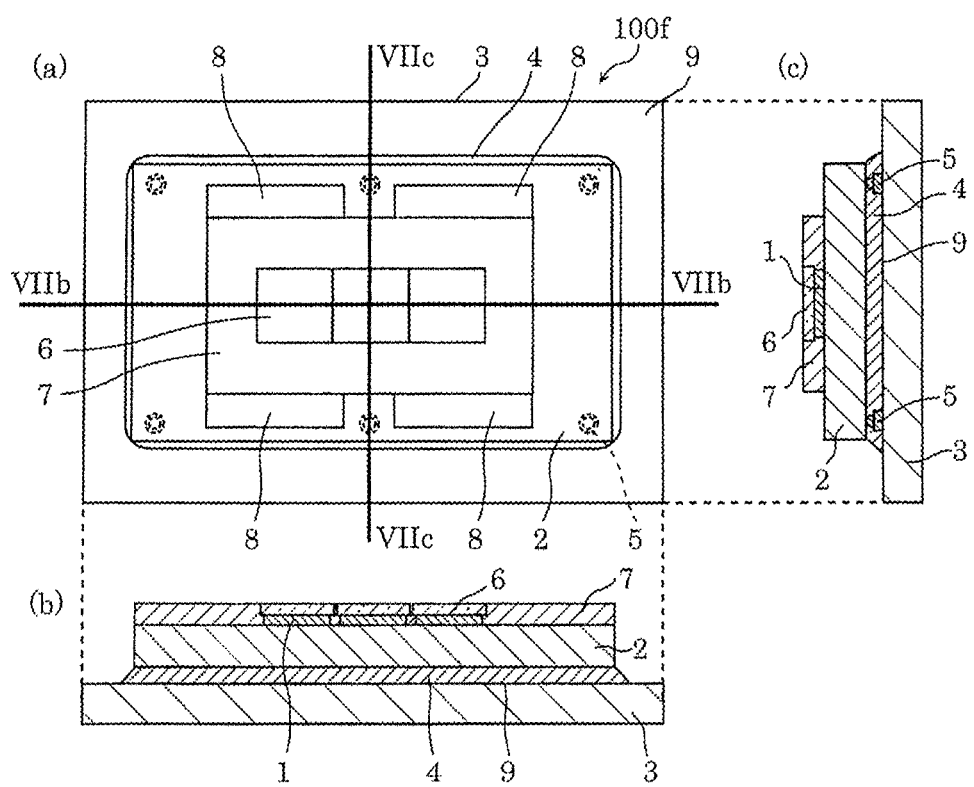
FIG. 7 is a schematic diagram illustrating a configuration of a semiconductor module according to Variation 3 of Embodiment 1, wherein (a) is a plan view of the configuration, (b) is a cross-sectional view of the configuration taken along line VIIb-VIIb in (a), and (c) is a cross-sectional view of the configuration taken along line VIIc-VIIc in (a).

FIG. 7 is a schematic diagram illustrating a configuration of semiconductor module 100f according to Variation 3 of Embodiment 1. In FIG. 7, (a) is a plan view of the configuration, (b) is a cross-sectional view of the configuration taken along line VIIb-VIIb in (a), and (c) is a cross-sectional view of the configuration taken along line VIIc-VIIc in (a).

In comparison with semiconductor module 100e shown in (a) to (c) in FIG. 6, semiconductor module 100f shown in (a) to (c) in FIG. 7 differs in the arrangement of LED elements 1, light-transmissive component 6, reflective resin 7, and second metal materials 5 disposed on wiring substrate 2. Specifically, when semiconductor module 100f is viewed from above as shown in (a) in FIG. 7, three LED elements 1 are arranged in a row along the direction of the long side (the X-axis direction) of wiring substrate 2. Reflective resin 7 covers the side surfaces of LED elements 1 and light-transmissive component 6, and is disposed away from the ends of wiring substrate 2. In the region except below the region in which LED elements 1 and reflective resin 7 are disposed on wiring substrate 2, and the region except below the regions in which electrodes 8 of wiring substrate 2 are disposed, second metal materials 5 are disposed in a total of six places including: all the four corners of wiring substrate 2; and two places close to the middle of wiring substrate 2 along the direction of the long side of wiring substrate 2. In other words, second metal materials 5 surround reflective resin 7.

With this configuration, in comparison with semiconductor module 100e according to Variation 2, semiconductor module 100f has the largest surface area of an exposed region from LED elements 1 and reflective resin 7 of wiring substrate 2, and allows mounting head tool 11 to apply pressure along the four sides of the periphery of wiring substrate 2. Consequently, semiconductor module 100f can minimize mounting inclination when wiring substrate 2 is secured to heat dissipation substrate 3, and achieves further satisfactory mounting stability between wiring substrate 2 and heat dissipation substrate 3.

Variation 4 of Embodiment 1

Figure 8:
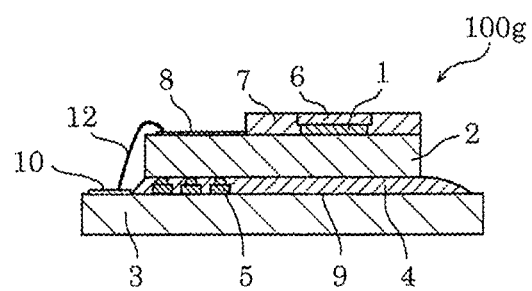
FIG. 8 is a cross-sectional schematic diagram illustrating a configuration of a semiconductor module according to Variation 4 of Embodiment 1.

Next, semiconductor module 100g according to Variation 4 of Embodiment 1 will be described. FIG. 8 is a cross-sectional schematic diagram illustrating a configuration of semiconductor module 100g according to Variation 4 of the present embodiment.

As shown in FIG. 8, semiconductor module 100g according to the present variation is characterized in that electrodes 8 on wiring substrate 2 on which semiconductor elements 1 are mounted are electrically connected to electrodes 10 on heat dissipation substrate 3 with metal wire 12 of Cu, Au, Al, etc. including, for example, ribbon bonding, and first metal material 4 is electrically conducted to none of semiconductor elements 1 and wiring substrate 2.

With this configuration, in semiconductor module 100g, even when first metal material 4 is insulated from semiconductor elements 1 and wiring substrate 2, (i) semiconductor elements 1 and wiring substrate 2 and (ii) heat dissipation substrate 3 are electrically connected via electrodes 8 and electrodes 10. As a result, semiconductor module 100g can maintain electrical characteristics that allow semiconductor module 100g to function, regardless of a state of bonding between wiring substrate 2 and heat dissipation substrate 3 with second metal materials 5 and first metal material 4.

Here, second metal materials 5 may include a material having thermal conductivity higher than that of first metal material 4, and be disposed directly below electrodes 8 of wiring substrate 2. In doing so, after wiring substrate 2 is mounted on heat dissipation substrate 3, when electrodes 8 on wiring substrate 2 and electrode 10 on heat dissipation substrate 3 are electrically connected with metal wire 12, second metal materials 5 are disposed under electrodes 8 of wiring substrate 2. Accordingly, thermal conduction between heat dissipation substrate 3 and wiring substrate 2 under electrodes 8 is placed in good condition.

With this configuration, in the case where application of heat from heat dissipation substrate 3 is necessary when electrodes 8 and electrode 10 are bonded with metal wire 12, electrodes 8 can be heated satisfactorily. In consequence, it is possible to stably bond wiring substrate 2 and heat dissipation substrate 3 with metal wire 12.

Variation 5 of Embodiment 1

Next, a semiconductor module according to Variation 5 of Embodiment 1 will be described. Since the present variation describes a combination of second metal material 5 and first metal material 4 and has no relation to the arrangement of components, the present variation is not shown.

First metal material 4 has a melting point lower than that of second metal material 5. Moreover, first metal material 4 has a bonded surface area larger than that of second metal material 5. In addition, second metal material 5 is more deformable due to a load applied at the time of bonding, and is more difficult to wettingly spread than first metal material 4.

The semiconductor module according to the present variation may include a combination of second metal material 5 as a bump including metal having Young's modulus of at most 150 GPa, and first metal material 4 as solder. Examples of the combination may include an Au bump and AuSn solder, a Cu—Ag—Au bump and SnAg-based solder, a Cu—Ag—Au bump and SnPb-based solder, an Sn bump and SnAg-based solder or SnPb-based solder, a Bi bump and SnAg-based solder or SnBi-based solder, a Pb bump and SnPb-based solder, an In bump and SnAg-based solder or SnPb-based solder, and an Al bump and SnZn-based solder.

The use of the combination of first metal material 4 and second metal material 5 including the above materials makes it possible to mount and bond second metal material 5 onto heat dissipation substrate 3, and to subsequently mount first metal material 4 on heat dissipation substrate 3. In this case, the temperature of first metal material 4 can be increased to be greater than or equal to a melting point by heating a stage below heat dissipation substrate 3. Next, mounting head tool 11 holds wiring substrate 2, and brings wiring substrate 2 in contact with second metal material 5 and also with first metal material 4 while applying pressure to wiring substrate 2 so that second metal material 5 is plastically deformed. Then, mounting head tool applies further pressure to wiring substrate 2 so that first metal material 4 is in contact with second metal material 5. As a result, first metal material 4 can be wettingly spread.

Moreover, by causing first metal material 4 and second metal material 5 to include the same metal such as Au-based, Cu-based, Ag-based, Sn-based, Bi-based, Pb-based, and In-based metal, it is possible to easily reduce void formation in first metal material 4 and second metal material 5 when first metal material 4 and second metal material 5 are bonded.

Embodiment 2

Hereinafter, Embodiment 2 will be described with reference to FIGS. 9 to 14.

The present embodiment describes a method for manufacturing semiconductor module 100 according to Embodiment 1 shown in (a) to (c) in FIG. 1.

FIGS. 9 to 14 are each a process chart illustrating a method for manufacturing semiconductor module 100. In each of FIGS. 9 to 14, (a) is a plan view, and (b) is a cross-sectional view taken along a corresponding one of IXb-IXb line, Xb-Xb line, XIb-XIb line, XIIb-XIIb line, XIIIb-XIIIb line, and XIVb-XIVb line in (a).

Figure 9:
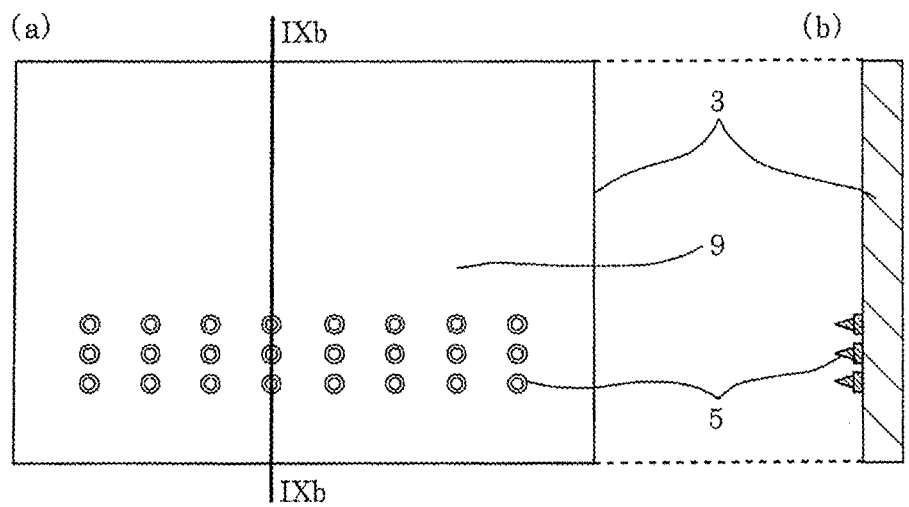
FIG. 9 is a process chart illustrating a method for manufacturing a semiconductor module according to Embodiment 2, wherein (a) is a plan view and (b) is a cross-sectional view taken along IXb-IXb line in (a).

First, as shown in FIG. 9, second metal materials 5 are mounted on predetermined parts of die pad region 9 on heat dissipation substrate 3 (mounting of a second metal material). Here, an example is shown in which second metal materials 5 are metal bumps including Au, Cu, etc., and stud bums are formed by bonding the metal bumps onto heat dissipation substrate 3 by ultrasonic welding.

Figure 10:
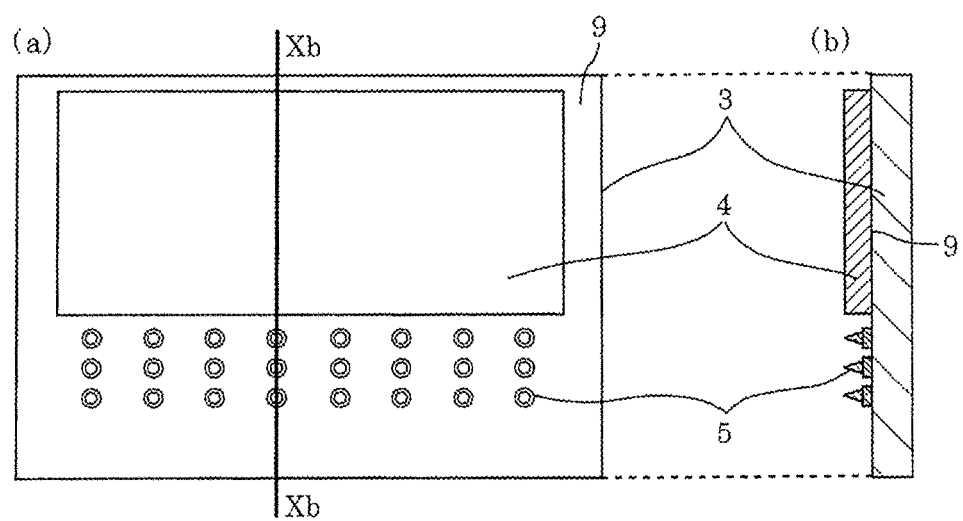
FIG. 10 is a process chart illustrating a method for manufacturing a semiconductor module according to Embodiment 2, wherein (a) is a plan view and (b) is a cross-sectional view taken along Xb-Xb line in (a).

Next, as shown in FIG. 10, heat dissipation substrate 3 is heated on a heating stage (not shown). After that, first metal material 4 is mounted on die pad region 9 (mounting of a first metal material). First metal material 4 is mounted as a metal pellet and heated at a temperature lower than or equal to the melting point thereof. For example, when an AuSn pellet is used as the metal pellet, the AuSn pellet is heated at approximately 250° C. that is a temperature lower than or equal to the melting point of AuSn. The AuSn pellet is not melted because the heating temperature is lower than or equal to the melting point. Moreover, the metal pellet as first metal material 4 has a thickness of approximately 50 μm, and is almost as high as or slightly lower than second metal materials 5. It should be noted that first metal material 4 is not limited to pellet materials, and may be paste materials. In this regard, however, the pellet materials are more suitable for the present method because the pellet materials shrink less after heating and cooling.

It should be noted that the order of the mounting of the first metal material and the mounting of the second metal material may be reversed, and the mounting of the first metal material and the mounting of the second metal material may be performed simultaneously. Moreover, in the mounting of the first metal material and the mounting of the second metal material, first metal material 4 and second metal materials 5 may be prevented from being in contact with each other.

Figure 11:
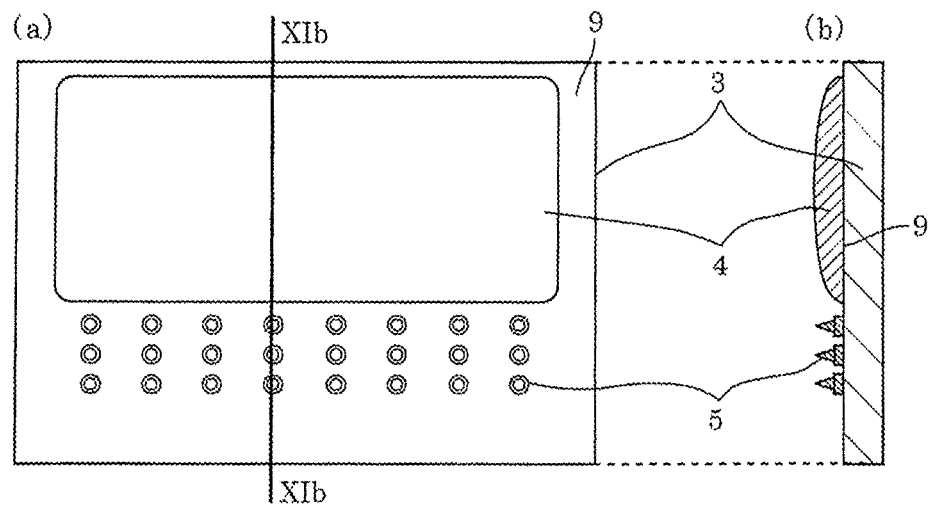
FIG. 11 is a process chart illustrating a method for manufacturing a semiconductor module according to Embodiment 2, wherein (a) is a plan view and (b) is a cross-sectional view taken along XIb-XIb line in (a).

Next, as shown in FIG. 11, heat dissipation substrate 3 is heated to a temperature higher than or equal to the melting point of first metal material 4 (heating). In this case, the heating stage (not shown) supporting heat dissipation substrate 3 from below is set to have a temperature that causes first metal material 4 to reach at least the melting point. For example, such a temperature may be at least 300° C. in the case of an AuSn material. Although first metal material 4 is melted in this state, first metal material 4 does not wettingly spread much on heat dissipation substrate 3 or die pad region 9, and remains in the mounting place shown in FIG. 10.

Figure 12:
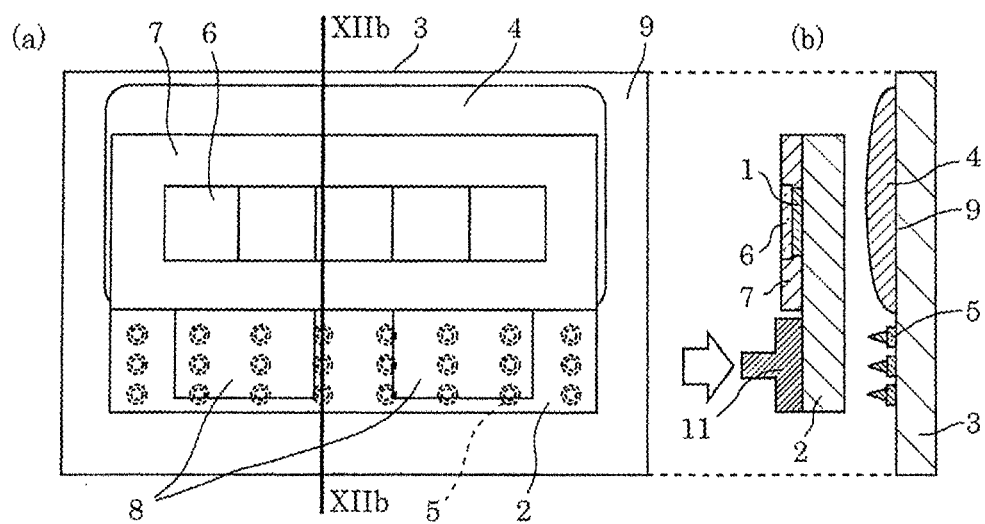
FIG. 12 is a process chart illustrating a method for manufacturing a semiconductor module according to Embodiment 2, wherein (a) is a plan view and (b) is a cross-sectional view taken along XIIb-XIIb line in (a).

Next, as shown in FIG. 12, wiring substrate 2 on which semiconductor elements 1 are mounted is positioned with heat dissipation substrate 3. While heat dissipation substrate 3 is being heated on the above-mentioned heating stage, wiring substrate 2 on which semiconductor elements 1 are mounted is prepared above heat dissipation substrate 3 to which first metal material 4 and second metal materials 5 are bonded, and is positioned with a desired mounting place, using mounting head tool 11.

Figure 13:
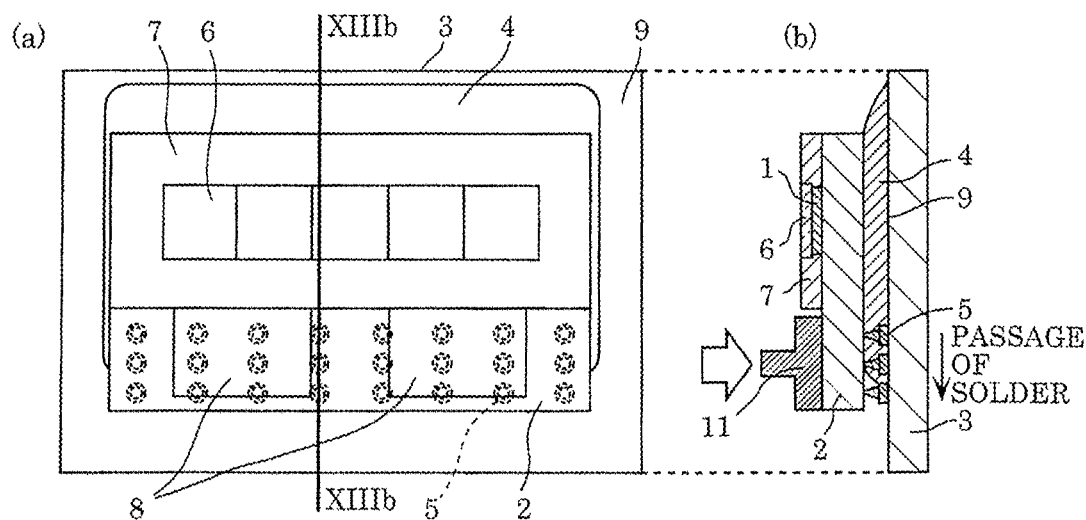
FIG. 13 is a process chart illustrating a method for manufacturing a semiconductor module according to Embodiment 2, wherein (a) is a plan view and (b) is a cross-sectional view taken along XIIIb-XIIIb line in (a).

Subsequently, as shown in FIG. 13, mounting head tool 11 presses wiring substrate 2 against heat dissipation substrate 3 on which first metal material 4 and second metal materials 5 are disposed, by thermal compression bonding (applying pressure). Consequently, wiring substrate 2 is boned to first metal material 4 and second metal materials 5.

In this process, while the tips of second metal materials 5 are being plastically deformed by wiring substrate 2 being pressed against the tips, wiring substrate 2 is secured at a desired position. Moreover, at the same time, first metal material 4 and second metal materials 5 may be deformed to have a desired height by pressing wiring substrate 2 against first metal material 4 that is melted, and pushing first metal material 4 toward the periphery of heat dissipation substrate 3. First metal material 4 wettingly spreads between wiring substrate 2 and heat dissipation substrate 3, and is at least in contact with or bonded to second metal materials 5. Concurrently, first metal material 4 and second metal materials 5 are melted and bonded to wiring substrate 2 and heat dissipation substrate 3.

It should be noted that although mounting head tool 11 may apply a load to semiconductor elements 1 of wiring substrate 2, as described in the present embodiment, semiconductor elements 1 may not be mounted above second metal materials 5, and second metal materials 5 may be plastically deformed while mounting head tool 11 is directly applying pressure to a portion of wiring substrate 2 on which semiconductor elements 1 are not mounted.

Moreover, in the present embodiment, when first metal material 4 and second metal materials 5 are disposed on the same bonding pad or the same electrodes on wiring substrate 2, first metal material 4 easily wettingly spreads in contact with second metal materials 5. Furthermore, similarly on heat dissipation substrate 3, when first metal material 4 and second metal materials 5 are bonded on the same die pad region 9, the same effect can be produced.

Figure 14:
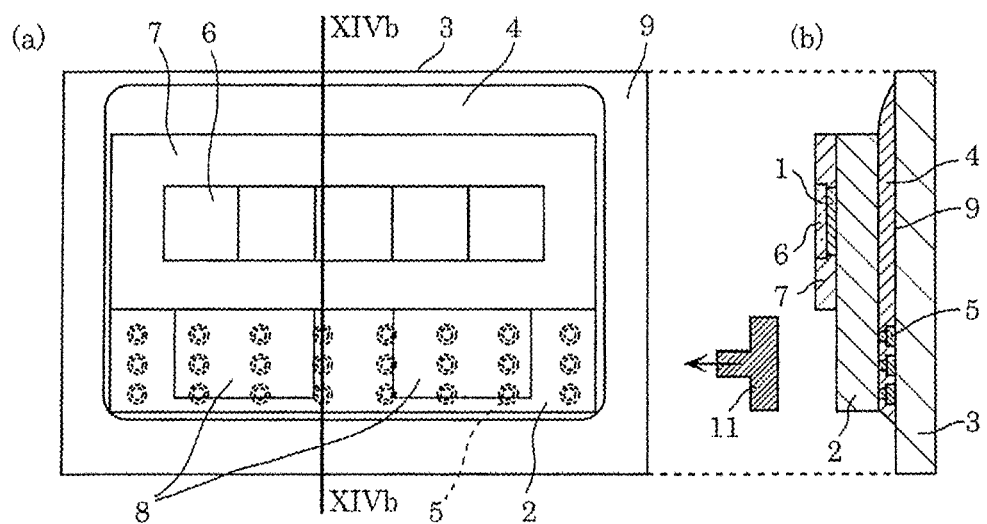
FIG. 14 is a process chart illustrating a method for manufacturing a semiconductor module according to Embodiment 2, wherein (a) is a plan view and (b) is a cross-sectional view taken along XIVb-XIVb line in (a).

Next, as shown in FIG. 14, mounting head tool 11 releases wiring substrate 2. Since the Au bumps of second metal materials 5 secure wiring substrate 2, even when mounting head tool 11 releases wiring substrate 2 in a state in which the AuSn solder of first metal material 4 is melted, a position gap does not occur along the X-axis direction, the Y-axis direction, and the Z-axis direction. After that, the bonding between wiring substrate 2 and heat dissipation substrate 3 is completed by removing heat dissipation substrate 3 on which wiring substrate 2 is disposed from the heating stage and cooling heat dissipation substrate 3.

In the method for manufacturing semiconductor module 100 according to the present embodiment, when wiring substrate 2 and heat dissipation substrate 3 are bonded, wiring substrate 2 and heat dissipation substrate 3 are secured by second metal materials 5. For this reason, even when mounting head tool 11 releases wiring substrate 2 in the state in which first metal material 4 is melted, a position gap does not occur between wiring substrate 2 and heat dissipation substrate 3. Accordingly, the method for manufacturing semiconductor module 100 according to the present embodiment makes it possible to bond wiring substrate 2 and heat dissipation substrate 3 in a short time, thereby improving the processing capacity.

Moreover, first metal material 4 bonds wiring substrate 2 and heat dissipation substrate 3 in a large surface area, and is also bonded to second metal materials 5. With both of these, it is possible to provide semiconductor module 100 having high bonding strength and high reliability.

Hereinafter, the characteristics common to Embodiment 1 and Embodiment 2 will be described in comparison with a conventional technique.

Figure 15:
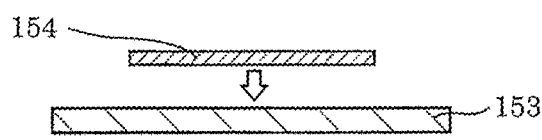
FIG. 15 is a cross-sectional diagram illustrating a method for manufacturing a semiconductor module according to a comparative example.
Figure 15:
Figure 15:
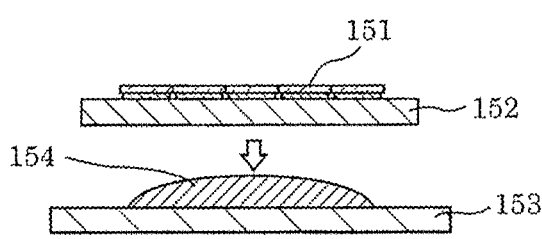
Figure 15:
Figure 15:
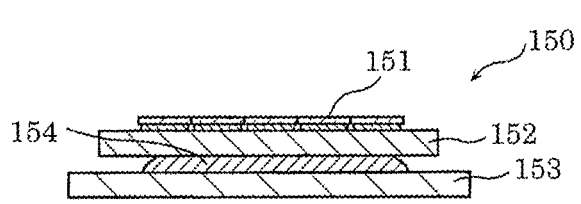

(a) to (c) in FIG. 15 are each a cross-sectional diagram illustrating a method for manufacturing semiconductor module 150 according to a comparative example.

In the method for manufacturing semiconductor module 150 according to the comparative example, first, as shown in (a) in FIG. 15, bonding material 154 is disposed on heat dissipation substrate 153. Next, as shown in (b) in FIG. 15, after bonding material 154 is melted, wiring substrate 152 on which semiconductor elements 151 are mounted is disposed above heat dissipation substrate 153 to which bonding material 154 is applied, using a mounting head tool (not shown). After that, wiring substrate 152 on which semiconductor elements 151 are mounted is pressed and bonded to heat dissipation substrate 153 to which bonding material 154 is applied. Finally, as shown in (c) in FIG. 15, semiconductor module 150 is manufactured by cooling bonding material 154.

In other words, in the above method, wiring substrate 152 on which semiconductor elements 151 are mounted is disposed above heat dissipation substrate 153 to which bonding material 154 is applied, and wiring substrate 152 on which semiconductor elements 151 are mounted is subsequently pressed and bonded to heat dissipation substrate 153 to which bonding material 154 is applied. With this method, the mounting head tool needs to continue to hold wiring substrate 152 on which semiconductor elements 151 are mounted, until cooling of bonding material 154 is completed.

In contrast, in the method for manufacturing semiconductor module 100 according to the present embodiment, because second metal materials 5 are used, second metal materials 5 and wiring substrate 2 are bonded in the heating, and wiring substrate 2 is secured to heat dissipation substrate 3 at the level of second metal materials 5. This securing makes it possible to highly accurately control the mounting accuracy such as a variation in height and inclination of wiring substrate 2 and semiconductor elements 1 mounted thereon relative to heat dissipation substrate 3.

Further, in the method for manufacturing semiconductor module 100 according to the present embodiment, first metal material 4 wettingly spreads between wiring substrate 2 and heat dissipation substrate 3 in a state in which wiring substrate 2 is secured to heat dissipation substrate 3 by second metal materials 5, and bonds wiring substrate 2 and heat dissipation substrate 3. Accordingly, mounting head tool 11 need not continue to hold wiring substrate 2 because of the securing by second metal materials 5. As a result, it is possible to bond wiring substrate 2 and heat dissipation substrate 3 using first metal material 4 in a short time, thereby improving the processing capacity.

Variation of Embodiment 2

Hereinafter, a variation of Embodiment 2 will be described with reference to FIG. 16. (a) to (c) in FIG. 16 are each a cross-sectional diagram illustrating a method for manufacturing a semiconductor module according to the variation of Embodiment 2.

Since the method for manufacturing semiconductor module 100 according to the variation of the present embodiment is similar to the method according to Embodiment 2 shown in FIGS. 9 to 14, only differences between those will be described.

Figure 16:
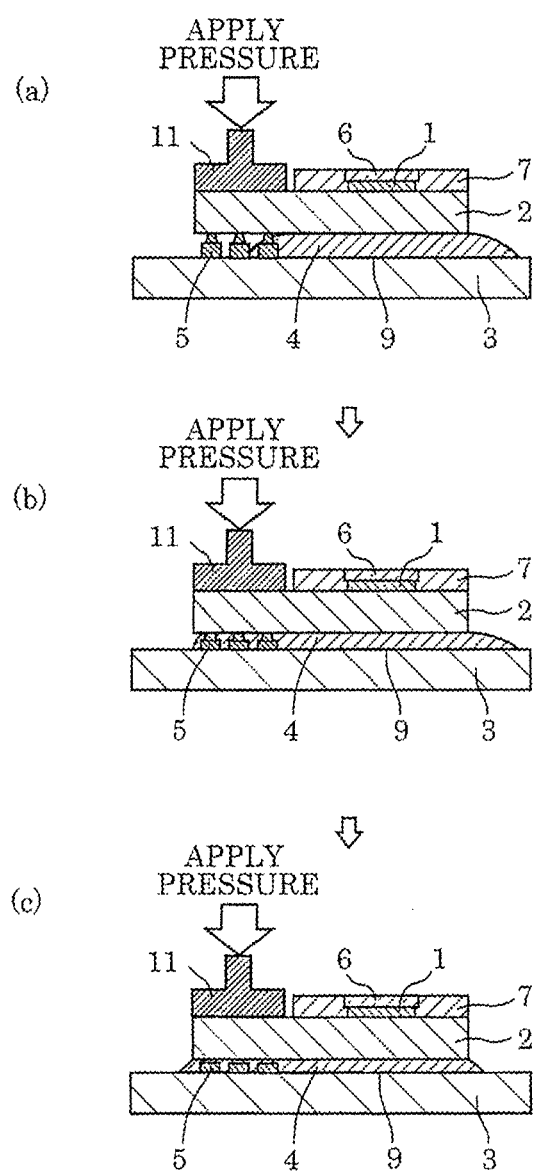
FIG. 16 is a cross-sectional diagram illustrating a method for manufacturing a semiconductor module according to a variation of Embodiment 2.

As shown in (a) to (c) in FIG. 16, the method for manufacturing semiconductor module 100 makes it possible to change a bonding state between first metal material 4 and second metal materials 5 as a finished product by changing conditions for mounting head tool 11 to apply pressure to wiring substrate 2.

(a) in FIG. 16 shows a state in which first metal material 4 is in contact with at least one of second metal materials 5, and (b) in FIG. 16 shows a state in which all of second metal materials 5 are in contact with or bonded to first metal material 4 by pressure being further applied.

In both of the states shown in (a) and (b) in FIG. 16, desired first metal material 4 and second metal materials 5 are bonded by causing first metal material 4 to be in contact with second metal materials 5 and to wettingly spread up to a portion to which mounting head tool 11 applies pressure while wiring substrate 2 is lowered to crush the tips of second metal materials 5.

It should be noted that in (a) in FIG. 16, there is the advantage that a bonding state between wiring substrate 2 and heat dissipation substrate 3 via second metal materials 5 can be easily observed by radioscopy etc.

In (b) in FIG. 16, all of second metal materials 5 are in contact with or bonded to first metal material 4, thereby improving the reliability of bonding between wiring substrate 2 and heat dissipation substrate 3.

Moreover, as shown in (c) in FIG. 16, when mounting head tool 11 further applies pressure to wiring substrate 2, a distance between wiring substrate 2 and heat dissipation substrate 3 is decreased, and a fillet is formed on heat dissipation substrate 3 by first metal material 4 being exposed toward the periphery of heat dissipation substrate 3 beyond an end of wiring substrate 2. This also makes it possible to bond the ends of wiring substrate 2 to heat dissipation substrate 3, thereby improving the bonding strength between them. Here, a fillet may be better formed by first metal material 4 being exposed from all the four sides of wiring substrate 2 including a portion other than the surroundings of second metal materials 5.

Other Embodiments

Although only some exemplary embodiments of the present disclosure have been described in detail above, those skilled in the art will readily appreciate that many modifications are possible in the exemplary embodiments without materially departing from the novel teachings and advantages of the present disclosure. Accordingly, all such modifications are intended to be included within the scope of the present disclosure.

INDUSTRIAL APPLICABILITY

The present disclosure is useful for headlamps including LEDs, semiconductor modules including LEDs for use in lighting devices having high optical accuracy, etc.

What is claimed is:

1. A semiconductor module, comprising:
   a semiconductor element;
   a first substrate having a first surface on which the semiconductor element is mounted, the first substrate being electrically connected to the semiconductor element;
   a second substrate having a third surface on which the first substrate is mounted, the third surface facing a second surface of the first substrate opposite the first surface;
   a first metal material disposed between the first substrate and the second substrate, the first metal material bonding the first substrate and the second substrate; and
   a second metal material disposed between the first substrate and the second substrate, the second metal material bonding the first substrate and the second substrate and having a melting point different from a melting point of the first metal material,
   wherein each of the following is at least partially bonded: (a) the first metal material and the first substrate, (b) the first metal material and the second substrate, (c) the second metal material and the first substrate, (d) the second metal material and the second substrate, and (e) the first metal material and the second metal material, and
   each of the following is bonded by alloying: (a) the first metal material and the first substrate, (b) the first metal material and the second substrate, and (c) the first metal material and the second metal material.

2. The semiconductor module according to claim 1, wherein the first metal material is bonded to the second metal material by thermal fusion.

3. The semiconductor module according to claim 1, wherein the second metal material is bonded to the first substrate by thermal compression bonding, and is bonded to the second substrate by ultrasonic welding.

4. The semiconductor module according to claim 1, wherein a bonded surface area of the first metal material and the first substrate and a bonded surface area of the first metal material and the second substrate are larger than a bonded surface area of the second metal material and the first substrate and a bonded surface area of the second metal material and the second substrate.

5. The semiconductor module according to claim 1, wherein the second metal material has a melting point higher than a melting point of the first metal material.

6. The semiconductor module according to claim 1, wherein a bonded surface area of the second metal material and the first substrate is smaller than a bonded surface area of the second metal material and the second substrate.

7. The semiconductor module according to claim 1, wherein only the first metal material is disposed between the first substrate and the second substrate directly under the semiconductor element.

8. The semiconductor module according to claim 1, wherein the second metal material is disposed only in a region directly under the first substrate.

9. The semiconductor module according to claim 1,
wherein the first metal material and the second metal material are disposed on a same bonding pad between the first substrate and the second substrate.

10. The semiconductor module according to claim 1, wherein the first metal material is disposed along a periphery of the second metal material.

11. The semiconductor module according to claim 1, wherein in a plan view of the first substrate and the second substrate, the first metal material protrudes from at least one of sides of the first substrate.

12. The semiconductor module according to claim 1, wherein the first metal material and the second metal material are not electrically bonded to the semiconductor element and the first substrate.

13. The semiconductor module according to claim 1, wherein the semiconductor element is a light-emitting diode,
a reflective resin is disposed on the first substrate on a lateral side of the semiconductor element, and
in a plan view of the second substrate on which the second metal material is disposed, the second metal material is disposed in a region other than a region in which the semiconductor element and the reflective resin are disposed.

14. The semiconductor module according to claim 1, wherein at least three second metal materials are disposed between the first substrate and the second substrate, the at least three second metal materials being each the second metal material, and
in a plan view of the second substrate on which the second metal material is disposed, the at least three second metal materials form a surface.

15. The semiconductor module according to claim 13, wherein in a plan view of the first substrate on which the second metal material is disposed, the second metal material is disposed between one of sides of the first substrate and a region in which the semiconductor element is disposed.

16. The semiconductor module according to claim 1, wherein the first substrate includes a first metal film on at least part of the second surface.

17. The semiconductor module according to claim 16, wherein the first metal film includes gold.

18. The semiconductor module according to claim 1, wherein the second substrate includes a second metal film on at least part of the third surface.

19. The semiconductor module according to claim 18, wherein the second metal film includes gold.

20. The semiconductor module according to claim 1, wherein the first metal material and the second metal material include different materials.

21. The semiconductor module according to claim 1, wherein the first metal material and the second metal material include a same material, and
the first metal material and the second metal material are bonded by metallic bonding.

* * * * *